United States Patent
Song et al.

(10) Patent No.: US 8,445,166 B2
(45) Date of Patent: May 21, 2013

(54) FABRICATION METHOD OF LITHOGRAPHY MASK AND FORMATION METHOD OF FINE PATTERN USING THE SAME

(75) Inventors: Ho Young Song, Suwon (KR); Dong You Kim, Gwangju (KR); Won Ho Jung, Asan (KR); Young Jin Cho, Seoul (KR); Young Chun Kim, Seongnam (KR)

(73) Assignee: Samsung Electronics Co., Ltd., Seoul (KR)

( * ) Notice: Subject to any disclaimer, the term of this patent is extended or adjusted under 35 U.S.C. 154(b) by 790 days.

(21) Appl. No.: 12/333,566

(22) Filed: Dec. 12, 2008

(65) Prior Publication Data
US 2010/0015535 A1    Jan. 21, 2010

(30) Foreign Application Priority Data
Jul. 16, 2008  (KR) .................. 10-2008-0069184

(51) Int. Cl.
*G03F 1/00* (2012.01)
*G03F 1/08* (2011.01)
*G03F 7/00* (2006.01)

(52) U.S. Cl.
USPC ............. 430/5; 430/311; 430/320; 430/321

(58) Field of Classification Search
USPC ................................ 430/5, 311, 320–321
See application file for complete search history.

(56) References Cited

U.S. PATENT DOCUMENTS

| | | | |
|---|---|---|---|
| 6,338,924 B1 * | 1/2002 | Tsuruma et al. | 430/5 |
| 2003/0175154 A1 * | 9/2003 | Hsu et al. | 422/57 |
| 2004/0149962 A1 * | 8/2004 | Andriessen | 252/500 |
| 2005/0174516 A1 * | 8/2005 | Yee et al. | 349/114 |
| 2005/0238967 A1 * | 10/2005 | Rogers et al. | 430/5 |
| 2006/0251972 A1 * | 11/2006 | Lee | 430/5 |
| 2008/0083484 A1 | 4/2008 | Blanchet et al. | |
| 2008/0202673 A1 * | 8/2008 | Forrest et al. | 156/232 |
| 2008/0233280 A1 * | 9/2008 | Blanchet et al. | 427/150 |

FOREIGN PATENT DOCUMENTS

| | | |
|---|---|---|
| KR | 10-2005-0077897 A | 8/2005 |
| KR | 10-2008-0024364 A | 3/2008 |

* cited by examiner

*Primary Examiner* — Mark F Huff
*Assistant Examiner* — Jonathan Jelsma
(74) *Attorney, Agent, or Firm* — McDermott Will & Emery LLP

(57) ABSTRACT

There is provided a method of fabricating a lithography mask, the method including: forming a transparent polymer layer on a surface of a first substrate where a convex-concave pattern is formed; separating the transparent polymer layer from the first substrate, the transparent polymer layer having a convex-concave surface formed by the convex-concave pattern of the first substrate transferred thereonto; depositing a metal thin film on the convex-concave surface; forming a viscous film on a second substrate; disposing the transparent polymer layer on the second substrate such that the viscous film and metal thin film are partially bonded together; and separating the transparent polymer layer from the second substrate such that a portion of the metal thin film bonded to the viscous film is removed, wherein a metal thin film pattern having the portion of the metal thin film removed therefrom is formed on the convex-concave surface.

13 Claims, 3 Drawing Sheets

FABRICATION METHOD OF LITHOGRAPHY MASK AND FORMATION METHOD OF FINE PATTERN USING THE SAME

CROSS-REFERENCE TO RELATED APPLICATIONS

This application claims the priority of Korean Patent Application No. 2008-69184 filed on Jul. 16, 2008, in the Korean Intellectual Property Office, the disclosure of which is incorporated herein by reference.

BACKGROUND OF THE INVENTION

1. Field of the Invention

The present invention relates to photo lithography, and more particularly, to a lithography mask and a method of forming a fine pattern using the same.

2. Description of the Related Art

Photo lithography is a process for forming a fine pattern in a semiconductor device and the like, and widely used in the semiconductor industry, electronic parts and electronic devices. Recently, a smaller size and more integration of a semiconductor device requires a finer pattern. Even a fine pattern of a submicron scale such as several nanometers is needed.

However, in a conventional lithography process, even in case of using an ultraviolet ray lamp providing a short wavelength light as a light source, a fine pattern of one micron or less can be hardly realized due to limitation caused by diffraction. For now, formation of the fine pattern of a submicron scale essentially necessitates holography or E-beam lithography using an expensive laser interferometer.

However, this equipment is very costly, and also entails delays in forming the pattern. Moreover, the equipment is not appropriate for forming the pattern in a large area and thus has considerable limitations in actual applications in the industrial field.

Furthermore, in the case of a conventional transmissive photomask, a metal pattern may be formed on a hard transparent substrate such as quartz and glass by various patterning techniques to selectively block transmission of light. This process, however, requires superior contact between the photomask and a photoresist layer to attain higher resolution than in the photo lithography process.

Therefore, a predetermined pressure is applied to ensure contact between the photomask and the photoresist. This process, when repeated, may contaminate the photomask and impair a deposited metal pattern, thereby requiring regular cleaning, maintenance and repair. Notably, the conventional photomask disadvantageously renders it impossible to perform a precise photo lithography process on a non-planar object such as a curved surface.

SUMMARY OF THE INVENTION

An aspect of the present invention provides a novel method of fabricating a lithography mask which ensures high resolution required for forming a fine pattern and allows for superior contact between a photomask and a pattern forming surface.

An aspect of the present invention also provides a lithography mask of a novel structure which ensures high resolution required for forming a fine pattern and allows for superior contact between a photomask and a pattern forming surface.

An aspect of the present invention also provides a method of forming a fine pattern using the lithography mask.

According to an aspect of the present invention, there is provided a method of fabricating a lithography mask, the method including: forming a transparent polymer layer on a surface of a first substrate where a convex-concave pattern is formed; separating the transparent polymer layer from the first substrate, the transparent polymer layer having a convex-concave surface formed by the convex-concave pattern of the first substrate transferred thereonto; depositing a metal thin film on the convex-concave surface of the transparent polymer layer; forming a viscous film on a second substrate; disposing the transparent polymer layer on the second substrate such that the viscous film and the metal thin film are partially bonded together; and separating the transparent polymer layer from the second substrate such that a portion of the metal thin film bonded to the viscous film is removed, wherein a metal thin film pattern having the portion of the metal thin film removed therefrom is formed on the convex-concave surface of the transparent polymer layer.

The transparent polymer layer may be formed of a transparent silicon resin-based elastomer. The second substrate may be a glass substrate, and the method further includes plasma-treating a top surface of the second substrate, before the forming a viscous film on a second substrate.

The viscous film may be a self-assembled monolayer. The self-assembled monolayer may be a thiol-based monolayer.

The metal thin film may be formed of one of Ag and Cu. The metal thin film may have a thickness of 20 to 100 nm.

According to another aspect of the present invention, there is provided a lithography mask including: a transparent polymer layer including a first main surface formed of a convex-concave surface and a second surface opposing the first surface; and a metal thin film pattern formed on the first main surface such that the transparent polymer layer is exposed at convexes of the convex-concave surface.

The transparent polymer layer may be a transparent resin-based elastomer. The metal thin film may be formed of one of Ag and Cu. The metal thin film may have a thickness of 20 to 100 nm.

According to still another aspect of the present invention, there is provided a method of forming a fine pattern, the method including: providing a lithography mask including a transparent polymer layer including a first main surface formed of a convex-concave surface and a second surface opposing the first surface; and a metal thin film pattern formed on the first main surface such that the transparent polymer layer is exposed at convexes of the convex-concave surface; forming a photoresist layer on a surface of an object where a fine pattern is to be formed; disposing the lithography mask on the object such that the first main surface of the lithography mask is in contact with the photoresist; selectively photo-etching the photoresist using the lithography mask to form a photoresist pattern; and forming a desired fine pattern on the object using the photoresist pattern.

The method for forming the fine pattern may be very beneficially employed as a process for forming a nano pattern of a submicron for a quantum crystal structure of a semiconductor light emitting diode.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

FIGS. 1A to 1E are procedural cross-sectional views illustrating a method of fabricating a lithography mask according to an exemplary embodiment of the invention.

Figure 1A:
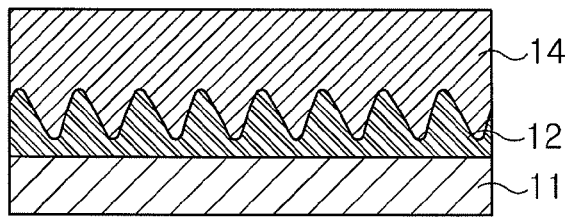
FIGS. 1A to 1E are procedural cross-sectional views illustrating a method of fabricating a lithography mask according to an exemplary embodiment of the invention.

As shown in FIG. 1A, in order to fabricate the lithography mask, first, a transparent polymer layer 14 is formed on a surface of a first substrate 11 where a convex-concave pattern 12 is formed.

In the present embodiment, the convex-concave pattern 12 is formed on an additional layer formed on a top of the first substrate 11. Alternatively, the convex-concave pattern 12 may be directly formed on the first substrate 12.

The convex-concave pattern 12 provided on the first substrate 11 may be formed by a known semiconductor process. In forming the convex-concave pattern, to fabricate fine convexes and concaves, equipment such as E-beam lithography equipment may be employed. The first substrate 11 having the convex-concave pattern 12 formed thereon may serve as a kind of master to fabricate a mask which is to be obtained in a later process. A material for the first substrate 11 is not limited, but may adopt a material capable of being separated smoothly from the transparent polymer layer 14 which is to be formed on a surface of the first substrate 11 where the convex-concave pattern is formed.

The polymer layer 14 formed on the convex-concave pattern surface of the first substrate 11 is made of a transparent material. The transparent polymer layer 14 can be formed by applying a liquid polymer material on the convex-concave pattern surface, spin-coating and curing the polymer material.

The transparent polymer layer 14 of the present embodiment may adopt a transparent silicon resin-based elastomer such as polydimethylsiloxane (PDMS). Here, the transparent polymer layer may have appropriate elasticity and thus can be solidly bonded to the photoresist in a later lithography process to enhance resolution.

Figure 1B:
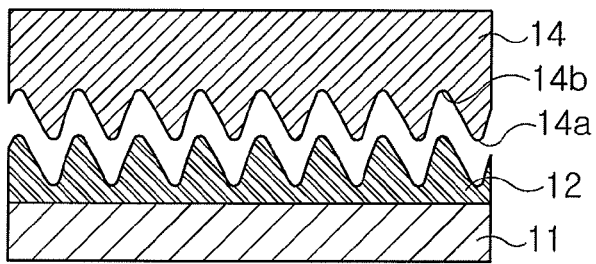

Thereafter, as shown in FIG. 1B, the cured transparent polymer layer 14 is separated from the first substrate. The cured transparent polymer layer has a convex-concave surface. The convex-concave surface of the transparent polymer layer 14 is a surface onto which the convex-concave pattern 12 of the first substrate 11 is transferred. Accordingly, the convex-concave surface includes convexes 14a and concaves 14b corresponding to the convex-concave pattern of the first surface.

Figure 1C:
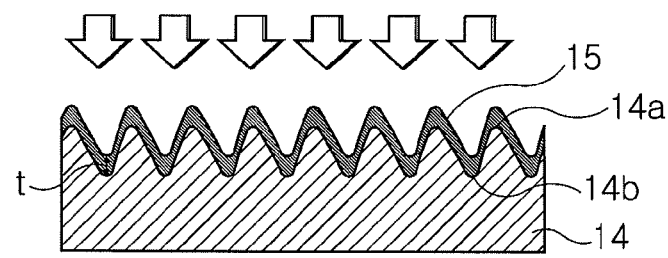

As shown in FIG. 1C, a metal thin film 15 is deposited on the convex-concave surface of the transparent polymer layer 14. The metal thin film may be formed of Ag or Cu. The metal thin film may have a thickness of 20 to 100 nm.

Figure 1D:
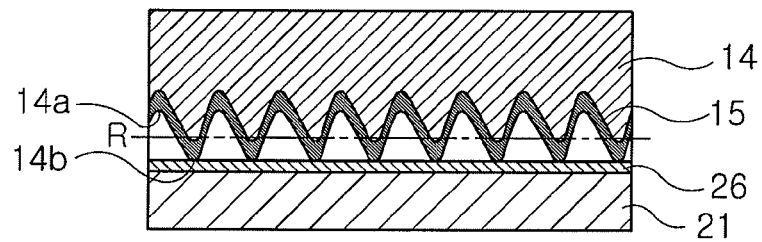

As shown in FIG. 1D, a viscous film 26 is formed on a second substrate 21. Then, the transparent polymer layer 14 is disposed on the second substrate 21 such that the viscous film 26 and the metal thin film 15 are partially bonded together.

The second substrate 21 may be a glass substrate. Before the forming of the viscous film 26 on the second substrate 21, a top surface of the second substrate 21 may be plasma-treated for some hours.

The viscous film 26 may be a self-assembled monolayer (SAM). In specific examples, the self-assembled monolayer may employ a thiol material such as 3-MPTMS, which is mercaptopropyltrimethoxy-silane. An MPTMS vapor is exposed on the plasma-treated glass substrate, and a condensation reaction between hydroxyl (—OH) group and silane group of the MPTMS is induced on a substrate to form a desired self-assembled monolayer.

Figure 1E:
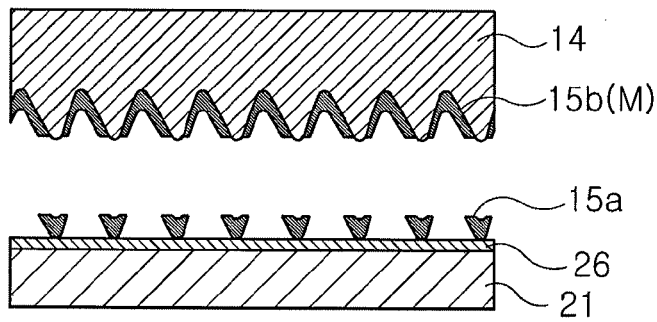

As shown in FIG. 1E, the transparent polymer layer 14 is separated from the second substrate 21 such that portions 15a of the metal thin film 15a bonded to the viscous film 26 are removed. This could be understood as a similar process to a nanotransfer printing method.

More specifically, the convex-concave surface having the metal thin film 15 formed thereon is adhered to the viscous film 26 and then the transparent polymer layer 14 is carefully released. Accordingly, portions of the metal thin film 15a located on the convexes are transferred onto the second substrate 21 having the viscous film 26 in contact therewith due to strong adhesion with a thiol-based (—SH) SAM.

With these processes, a metal thin film pattern M where the metal thin film 15a located at the convexes is partially removed is formed on the transparent polymer layer 14.

Figure 2:
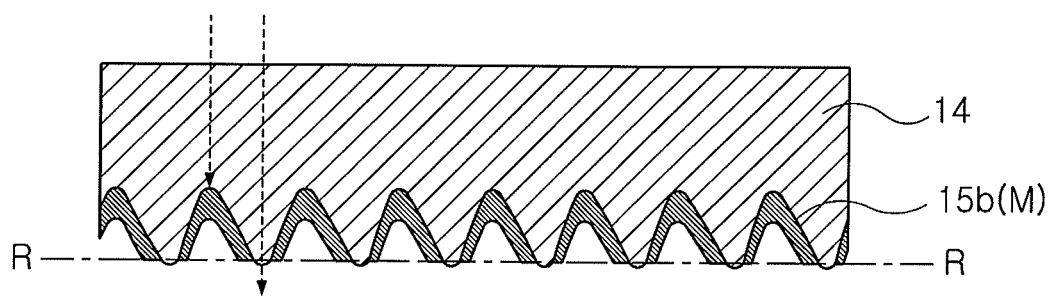
FIG. 2 is a cross-sectional view illustrating a lithography mask fabricated according to an exemplary embodiment of the invention shown in FIGS. 1A to 1E.

FIG. 2 is a cross-sectional view illustrating a lithography mask fabricated according to an exemplary embodiment of the invention shown in FIGS. 1A to 1E.

The lithography mask shown in FIG. 2 includes a transparent polymer layer 14 having a first main surface formed of a convex-concave surface and a second main surface opposing the first main surface, and a metal thin film pattern 15b (M) formed on the convex-concave surface. The metal thin film pattern M has exposed portions of the transparent polymer layer 14 at convexes 14a on the convex-concave surface of the transparent polymer layer 14. In a process shown in FIG. 1D, portions of the metal thin film bonded to the viscous film, i.e., portions located below a reference plane R are removed.

The first main surface of the transparent polymer layer 14 is a contact surface with a photoresist layer and the second main surface is a surface where light such as ultraviolet rays is irradiated. As indicated with an arrow, through the exposed portions of the transparent polymer layer 14, a portion of the photoresist layer adjacent to an open area of the transparent polymer layer is exposed and the other portion is blocked.

The convexes and concaves may be shaped such that portions between convexes and concaves each have an inclined surface toward the second main surface to prevent a decline in resolution resulting from scattering of light. That is, the convexes and concaves are configured to have inclined surfaces toward the second main surface. This prevents ultraviolet rays propagating toward the metal thin film pattern (M) from being scattered and exposed around the open area but allows the ultraviolet rays to be guided into the second main surface.

The transparent polymer layer 14 constituting the lithography mask may be a transparent silicon resin-based elastomer. The metal thin film may employ Ag or Cu. The metal thin film may have a thickness of 20 to 10 mm.

The lithography mask of the present embodiment has a body defined by the transparent polymer layer 14 and a metal thin film pattern formed on a convex-concave surface of the transparent polymer layer 14 to effectively prevent a decline in resolution resulting from diffraction-induced interference. That is, when light enters the transparent polymer layer which is formed of a transparent material, the transparent polymer layer 14 may serve as a light source and be solidly bonded to a photoresist layer so as to be exposed through the open area of the convexes. This prevents a decrease in resolution due to diffraction and ensures high resolution in an exposure process using a general ultraviolet lamp.

Moreover, the transparent polymer layer 14 has predetermined elasticity. Thus, despite any unevenness on a surface of the photoresist layer, the mask can be adequately bonded along the surface without external pressure and can be prevented from being contaminated due to the external pressure.

FIGS. 3A to 3D are procedural cross-sectional view illustrating a method of forming a fine pattern using a lithography mask shown in FIG. 2.

In order to form the fine pattern according to the present embodiment, first, a lithography mask shown in FIG. 2 is provided.

Figure 3A:
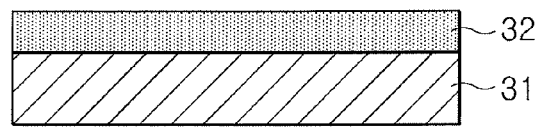
FIGS. 3A to 3D are procedural cross-sectional views illustrating a method of forming a fine pattern using the lithography mask shown in FIG. 2.

Then, as shown in FIG. 3A, a photoresist layer 32 is formed on a surface of an object 31 where the fine pattern is to be formed.

This object 31 may be a semiconductor device manufactured in various shapes or a wafer for manufacturing the semiconductor device. The object may be a wafer for a semiconductor light emitting device requiring a photon crystal structure. The photon crystal structure of the semiconductor light emitting device needs to have a fine pattern of a submicron scale periodically formed and thus can be obtained effectively by a method of the present embodiment.

Figure 3B:
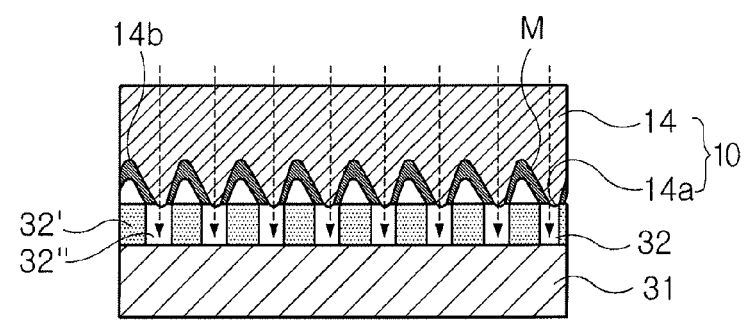

Afterwards, as shown in FIG. 3B, the lithography mask 10 is disposed on the object such that the first main surface of the lithography mask is in contact with the photoresist 32. Subsequently, an exposure process is performed to employ a photoetching process.

In the present embodiment, portions of the pattern where the metal thin film M is removed are in contact with the photoresist layer 32 but an ultraviolet ray is selectively irradiated onto only the contact portions 32". Accordingly, the transparent polymer layer 14 formed of, for example, a silicon elastomer can be closely bonded to the photoresist layer 32, thereby allowing an ultraviolet ray to be irradiated more precisely.

Furthermore, the mask 10 of the present embodiment has the transparent polymer layer 14 as a body and thus can be superbly in contact with a large-scale substrate or a nonplanar curved substrate. Thus, an additional pressure does not need to be applied to achieve superior contact. Also, the open area 14a located on the convexes is in contact with the photoresist layer 3. This prevents the pattern from being damaged due to repetitive use and the resolution from being degraded.

Figure 3C:
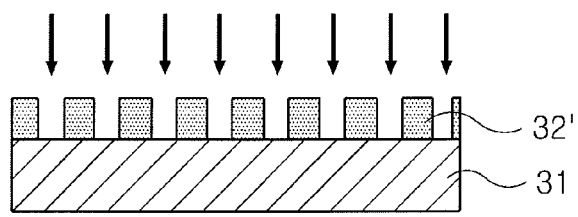
Figure 3D:
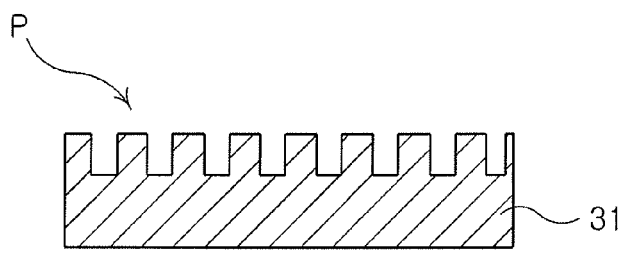

As shown in FIG. 3C, portions of the photoresist layer where light is irradiated using the lithography mask 10 is developed and removed to form a desired photoresist pattern 32'. Thereafter, as shown in FIG. 3D, a fine pattern P is formed on the object 31 using the photoresist pattern 32'.

As set forth above, according to exemplary embodiments of the invention, a lithography mask is employed to ensure a fine pattern is easily formed. A micro pattern of a submicron scale can be easily fabricated without utilizing expensive equipment such as E-beam lithography or laser holography. Also, this easily produces the fine pattern of a submicron scale which cannot be obtained by a conventional mask, for example, a chrome coating mask due to diffraction limitation even when identical light source, i.e., an ultraviolet lamp is employed Moreover, a process of fabricating a mask is very simple, and not different or limited compared with conventional photo lithography. Therefore, the fabrication process has little barrier to application of the conventional semiconductor process. Furthermore, a material and structure of the lithography mask of the present embodiment can be applied to a large scale substrate and a curved substrate due to excellent contact with a photoresist layer where a pattern is to be formed.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of fabricating a lithography mask, the method comprising:
    forming a transparent polymer layer on a surface of a first substrate where a convex-concave pattern is formed;
    separating the transparent polymer layer from the first substrate, the transparent polymer layer having a convex-concave surface formed by the convex-concave pattern of the first substrate transferred thereto and a planar surface onto which light is irradiated, opposing the convex-concave surface;
    depositing a metal thin film on the convex-concave surface of the transparent polymer layer;
    forming a self-assembled monolayer on a second substrate;
    disposing the transparent polymer layer on the second substrate such that the self-assembled monolayer and the metal thin film are partially bonded together; and
    separating the transparent polymer layer from the second substrate such that a portion of the metal thin film bonded to the self-assembled monolayer is removed,
    wherein a metal thin film pattern having the portion of the metal thin film removed therefrom is formed on the convex-concave surface of the transparent polymer layer, and
    wherein portions of the convex-concave surface between convexes and concaves are inclined with respect to the planar surface, and
    wherein portions of an outer surface of the metal thin film pattern are inclined with respect to the planar surface.

2. The method of claim 1, wherein the transparent polymer layer is formed of a transparent silicon resin-based elastomer.

3. The method of claim 1, wherein the second substrate is a glass substrate, and
    the method further comprises plasma-treating a top surface of the second substrate, before the forming a self-assembled monolayer on a second substrate.

4. The method of claim 1, wherein the self-assembled monolayer is a thiol-based monolayer.

5. The method of claim 1, wherein the metal thin film is formed of one of Ag and Cu.

6. The method of claim 1, wherein the metal thin film has a thickness of 20 to 100 nm.

7. A lithography mask comprising:
    a transparent polymer layer including a first main surface having a convex-concave surface and a second main surface opposing the first main surface, the second main surface having light irradiated there onto; and
    a metal thin film pattern formed on the first main surface such that the transparent polymer layer is exposed at convex portions of the convex-concave surface,
    wherein portions of the first main surface between convexes and concaves are inclined with respect to the second main surface, and
    wherein portions of an outer surface of the metal thin film pattern are inclined with respect to the second main surface.

8. The lithography mask of claim 7, wherein the transparent polymer layer is a transparent resin-based elastomer.

9. The lithography mask of claim 7, wherein the metal thin film is formed of one of Ag and Cu.

10. The lithography mask of claim 7, wherein the metal thin film has a thickness of 20 to 100 nm.

11. A method of forming a fine pattern, the method comprising:
- providing a lithography mask comprising a transparent polymer layer including a first main surface having a convex-concave surface and a second main surface opposing the first main surface, the second main surface having light irradiated there onto; and a metal thin film pattern formed on the first main surface such that the transparent polymer layer is exposed at convex portions of the convex-concave surface, wherein portions of the first main surface between convexes and concaves are inclined with respect to the second main surface, and wherein portions of an outer surface of the metal thin film pattern are inclined with respect to the second main surface;
- forming a photoresist layer on a surface of an object where a fine pattern is to be formed;
- disposing the lithography mask on the object such that the first main surface of the lithography mask is in contact with the photoresist;
- selectively photo-etching the photoresist using the lithography mask to form a photoresist pattern; and
- forming a desired fine pattern on the object using the photoresist pattern.

12. The method of claim 11, wherein the providing a lithography mask comprises:
- forming the transparent polymer layer on a surface of a first substrate where a convex-concave pattern is formed;
- separating the transparent polymer layer from the first substrate, the transparent polymer layer having a convex-concave surface formed by the convex-concave pattern of the first substrate transferred thereto;
- depositing a metal thin film on the convex-concave surface of the transparent polymer layer;
- forming a self-assembled monolayer on a second substrate;
- disposing the transparent polymer layer on the second substrate such that the self-assembled monolayer and the metal thin film are partially bonded together; and
- separating the transparent polymer layer from the second substrate such that a portion of the metal thin film bonded to the self-assembled monolayer is removed,
- wherein a metal thin film pattern having the portion of the metal thin film removed therefrom is formed on the convex-concave surface of the transparent polymer layer.

13. The method of claim 11, wherein the object is a semiconductor light emitting diode.

* * * * *